United States Patent [19]

Sleight et al.

[11] Patent Number: 5,126,316

[45] Date of Patent: Jun. 30, 1992

[54] $Bi_2Sr_{3-x}Y_xCu_2O_{8+y}$ SUPERCONDUCTING METAL OXIDE COMPOSITIONS

[75] Inventors: Arthur W. Sleight, Kennett Square, Pa.; Munirpallam A. Subramanian, New Castle, Del.

[73] Assignee: E. I. Du Pont de Nemours and Company, Wilmington, Del.

[21] Appl. No.: 236,081

[22] Filed: Aug. 24, 1988

[51] Int. Cl.⁵ .............. C01F 11/02; C01G 3/02; C01G 29/00; H01L 39/12
[52] U.S. Cl. .............. 505/1; 252/521; 423/593; 423/604; 423/617; 501/94; 501/123; 501/126; 505/779; 505/782
[58] Field of Search ........ 423/593, 604, 617; 502/340, 345, 353; 501/123, 126, 94; 252/521; 505/1, 779, 782

[56] References Cited

U.S. PATENT DOCUMENTS 4,843,059 6/1989 Deslandes et al. ............ 252/521

OTHER PUBLICATIONS

Kaneko, "On the Coprecipitation Method for the Preparation . . . ", *Jap. Jnl. Appl. Phys.*, vol. 26(5), May 1987, pp. L734-L735.
Oda, "Oxygen Deficiency in $YM_2Cu_3O_{7+y}$ (m=Ba, Sr) Family", *Jap. Jnl. Appl. Phys*, vol. 26(5), May 1987, pp. L804-L806.
Kijima, "Superconductivity in the Bi-Sr-La-Cu-O System", *Jap. Jnl. Appl. Phys.*, vol. 27(6), Jun. 1988, pp. L1035-L1037.
Jung, "Effect of Substitution of Bi, Ga, Fe on . . . $YBa_2$-$Cu_3O_x$", *Physical Rev. B.*, vol. 37(13), May 1, 1988, pp. 7510-7515.
Franck, "Superconductivity in Systems of Compositions $(M_xY_{1-x})Ba_2Cu_3O_x$. . . ", *Rev. Sol. State Sci.*, vol. 1(2), 1987, pp. 405-410.
Varadaraju, "Effect of Chemical Substitution on . . . $YBa_2Cu_3O_x$", *Physica 148B*, 1987, pp. 417-418.
Fukushima, "Transition to an Insulator from a Superconductor . . . ", *Jpn. Jnl. of Appl. Phys.*, vol. 27, No. 5, May 1988, pp. L790-L791.
Yoshizaki, "Superconducting and Magnetic Properties of $Bi_2Sr_2Ca_{1-x}Y_xCu_2O_y$", *Physica C* 152, May 1988, pp. 408-412.
Bednorz et al., Z. Phys., B64, 189 (1986).
Rao et al., Current Science, 56, 47 (1987).
Chu et al., Science, 235, 567 (1987).
Chu et al., Phys. Rev. Lett., 58, 405 (1987).
Cava et al., Phys. Rev. Lett., 58, 408 (1987).
Bednorz et al., Europhys. Lett., 3, 379 (1987).
Maeda et al., Jpn. J. Appl. Phys., 27, L209 (1988).
Subramanian et al., Science, 239, 1015 (1988).
Tamegai et al., Jpn. J. Appl. Phys., 27, L1074 (1988).
Manthiram et al., Appl. Phys. Lett., 53, 420 (1988).

*Primary Examiner*—Paul Lieberman
*Assistant Examiner*—John Boyd

[57] ABSTRACT

Compositions having the nominal formula $Bi_2Sr_{3-x}Y_x$-$Cu_2O_{8+y}$ wherein x is from about 0.05 to about 0.45 and y is from about 0 to about 1 are superconducting.

6 Claims, 1 Drawing Sheet

FLUX EXCLUSION-3    BACKGROUND-2    SAMPLE-1

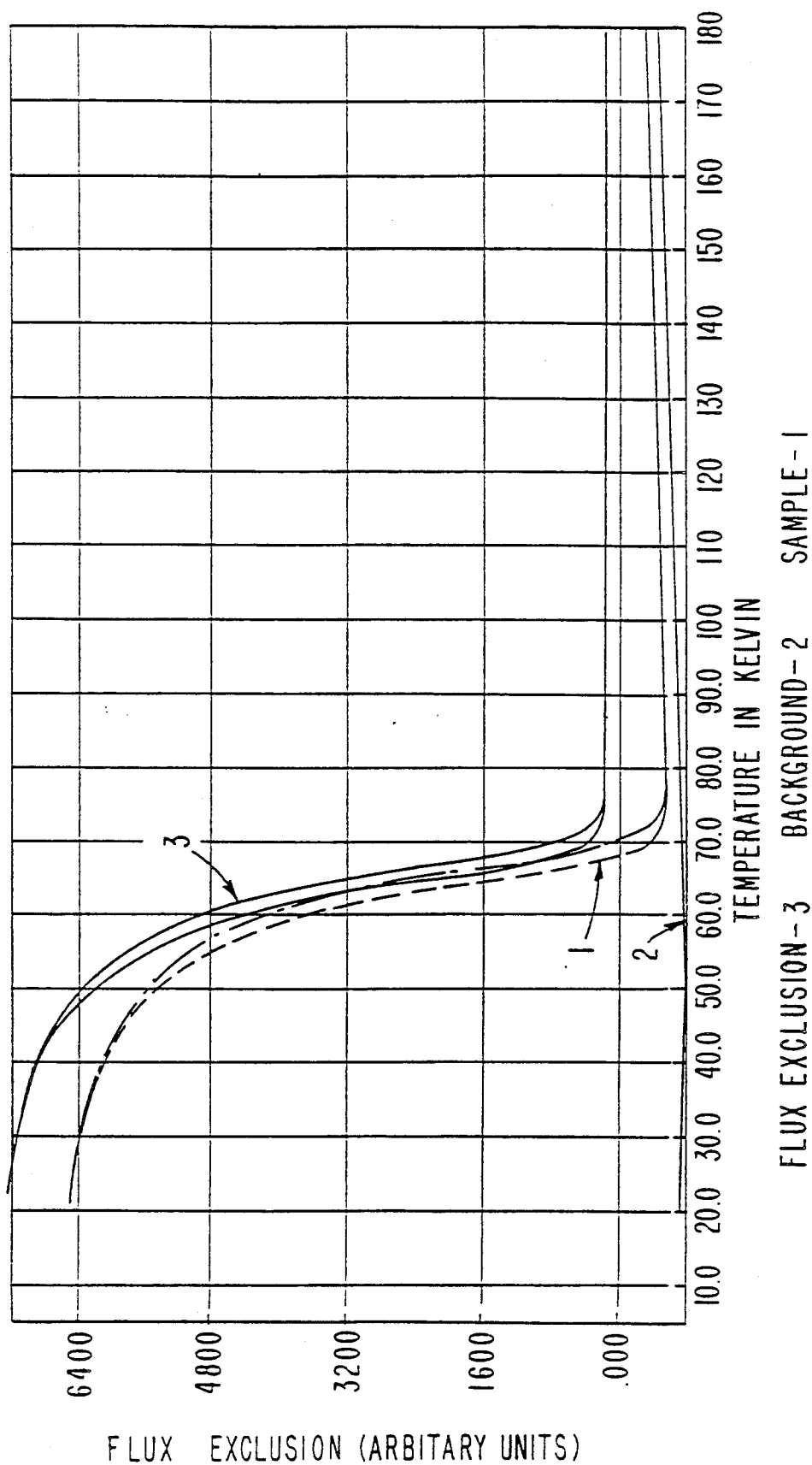

$Bi_2Sr_{3-x}Y_xCu_2O_{8+y}$ SUPERCONDUCTING METAL OXIDE COMPOSITIONS

BACKGROUND OF THE INVENTION

1. Field of the Invention

This invention relates to a superconducting composition comprised of a crystalline metal oxide phase in the Bi-Sr-Y-Cu-O system.

2. References

Bednorz and Muller, Z. Phys. B64, 189 (1986), disclose a superconducting phase in the La-Ba-Cu-O system with a superconducting transition temperature of about 35 K. This disclosure was subsequently confirmed by a number of investigators [see, for example, Rao and Ganguly, Current Science, 56, 47 (1987), Chu et al., Science 235, 567 (1987), Chu et al., Phys. Rev. Lett. 58, 405 (1987), Cava et al., Phys. Rev. Lett. 58, 408 (1987), Bednorz et al., Europhys. Lett. 3, 379 (1987)]. The superconducting phase has been identified as the composition $La_{1-x}(Ba,Sr,Ca)_xCuO_{4-y}$ with the tetragonal $K_2NiF_4$-type structure and with x typically about 0.15 and y indicating oxygen vacancies.

Wu et al., Phys. Rev. Lett. 58, 908 (1987), disclose a superconducting phase in the Y-Ba-Cu-O system with a superconducting transition temperature of about 90 K. Cava et al., Phys. Rev. Lett. 58, 1676 (1987), have identified this superconducting Y-Ba-Cu-O phase to be orthorhombic, distorted, oxygen-deficient perovskite $YBa_2Cu_3O_{9-\delta}$ where $\delta$ is about 2.1 and present the powder x-ray diffraction pattern and lattice parameters.

C. Michel et al., Z. Phys. B-Condensed Matter 68, 421 (1987), disclose a novel family of superconducting oxides in the Bi-Sr-Cu-O system with composition close to $Bi_2Sr_2Cu_2O_{7+\delta}$. A pure phase was isolated for the composition $Bi_2Sr_2Cu_2O_{7+\delta}$. The X-ray diffraction pattern for this material exhibits some similarity with that of perovskite and the electron diffraction pattern shows the perovskite subcell with the orthorhombic cell parameters of a=5.32 A (0.532 nm), b=26.6 A (2.66 nm) and c =48.8 A (4.88 nm). The material made from ultrapure oxides has a superconducting transition with a midpoint of 22 K as determined from resistivity measurements and zero resistance below 14 K. The material made from commercial grade oxides has a superconducting transition with a midpoint of 7 K.

H. Maeda et al., Jpn. J. Appl. Phys. 27, L209 (1988), disclose a superconducting oxide in the Bi-Sr-Ca-Cu-O system with the composition near $BiSrCaCu_2O_x$ and a superconducting transition temperature of about 105 K.

The commonly assigned application, "Superconducting Metal Oxide Compositions and Process For Making Them", S. N. 153,107, filed Feb. 8, 1988, a continuation-in-part of S. N. 152,186, filed Feb. 4, 1988, disclose superconducting compositions having the nominal formula $Bi_aSr_bCa_cCu_3O_x$ wherein a is from about 1 to about 3, b is from about ⅜ to about 4, c is from about 3/16 to about 2 and x=(1.5 a+b+c +y) where y is from about 2 to about 5, with the proviso that b+c is from about 3/2 to about 5, said compositions having superconducting transition temperatures of about 70 K or higher. It also discloses the superconducting metal oxide phase having the formula $Bi_2Sr_{3-z}Ca_zCu_2O_{8+w}$ wherein z is from about 0.1 to about 0.9, preferably 0.4 to 0.8 and w is greater than zero but less than about 1. M. A. Subramanian et al., Science 239, 1015 (1988) also disclose the $Bi_2Sr_{3-x}Ca_zCu_2O_{8+w}$ superconductor.

T. Tamegai et al., Jpn. J. Appl. Phys. 27, L1074 (1988), disclose that $Bi_2Sr_2YCu_2O_{8.5}$ is not a superconductor but is instead a semiconductor.

A. Manthiram et al., Appl. Phys. Lett. 53, 420 (1988), disclose the results of a study of the compositions $Bi_4Sr_3Ca_{3-x}Y_xO_{16+\delta}$. Samples with $0.0 \leq x \leq 1.1$ are superconductors; those with $x \geq 1.25$ are semiconductors. $T_c$ remains almost constant at 86 K in the compositional range $0 \leq x \leq 0.5$ and then drops abruptly and monotonically with x for x>0.5, extrapolating to zero at x of about 1.15.

SUMMARY OF THE INVENTION

This invention provides novel superconducting compositions having the nominal formula $Bi_2Sr_{3-x}Y_xCu_2O_{8+y}$ wherein x is from about 0.05 to about 0.45 and y is from about 0 to about 1. The midpoint of the superconductivity for transition these compositions is at least 60 K.

BRIEF DESCRIPTION OF THE DRAWINGS

FIG. 1 shows a plot of the flux excluded by a composition of this invention as a function of temperature.

DETAILED DESCRIPTION OF THE INVENTION

The superconducting compositions of this invention can be prepared by the following process. Quantities of the oxide reactants or their precursor are chosen with the atomic ratio of Bi:Sr:Y:Cu of 2:3-x:x:2 wherein x is from about 0.05 to about 0.45 and mixed, for example, by grinding them together in a mortar. The mixed powder may then be heated directly or it can be first formed into a pellet or other shaped object and then heated. The powder or pellet is placed in a crucible made of a non-reacting metal such as gold. The crucible is then placed in a furnace and heated to about 850° C. to about 925° C. for about 3 hours or more. The power to the furnace is then turned off and the crucible is furnace-cooled to ambient temperature, about 20° C. The crucible is then removed from the furnace and the black product recovered.

When the quantities of the reactants are chosen such that x is from about 0.3 to about 0.4, the product is single phase. Superconducting compositions of this invention corresponding to values of x less than about 0.3 are comprised of this superconducting phase.

Superconductivity can be confirmed by observing magnetic flux exclusion, i.e., the Meissner effect. This effect can be measured by the method described in an article by E. Polturak and B. Fisher in Physical Review B, 36, 5586(1987).

The superconducting compositions of this invention can be used to conduct current extremely efficiently or to provide a magnetic field for magnetic imaging for medical purposes. Thus, by cooling the composition in the form of a wire or bar to a temperature below the superconducting transition temperature $T_c$ in a manner well known to those in this field and initiating a flow of electrical current, one can obtain such flow without any electrical resistive losses. To provide exceptionally high magnetic fields with minimal power losses, the wire mentioned previously could be wound to form a coil which would be cooled below $T_c$ before inducing any current into the coil. Such fields can be used to levitate objects as large as railroad cars. These superconducting compositions are also useful in Josephson devices such as SQUIDS (superconducting quantum interference devices) and in instruments that are based on the Josephson effect such as high speed sampling circuits and voltage standards.

EXAMPLES OF THE INVENTION EXAMPLES 1-4, EXPERIMENTS A-B

Compositions corresponding to x=0.1, 0.2, 0.3, 0.4, 0.5 and 0.8 in the formula $Bi_2Sr_{3-x}Y_xCu_2O_{8+y}$ were prepared by grinding in an agate mortar for about 30 minutes the quantities of $Bi_2O_3$, $SrO_2$, $Y_2O_3$, and CuO shown in Table I for each Example and Experiment. Pellets, 10 mm in diameter and about 3 mm thick, were pressed from this mixed powder for each composition. In each the pellets were placed in a gold crucible The crucible was placed in a furnace and heated at a rate of 5° C. per minute to 900° C. and then held at 900° C. for 24 hours. Power to the furnace was then shut off and the crucible was allowed to cool to room temperature in the furnace. The crucible was then removed from the furnace and the black product was recovered.

X-ray powder diffraction patterns of the product of each Example showed that when x is 0.3 and 0.4, the product is essentially single phase. When x is 0.1 and 0.2, the product contains other phases as well as the phase detected when x is 0.3 and 0.4. The X-ray data were indexed on a psuedotetragonal unit cell and the lattice parameters are given in Table II.

Meissner effect measurements were carried out and the temperature of the midpoint of the superconductivity transition is shown in Table II. The results for Example 3, x=0.3, are shown in FIG. 1 where the flux exclusion is plotted as a function of temperature. The products of Experiments A and B, x=0.5 and x=0.8 were not superconducting at temperatures as low as 4.2 K.

TABLE I

| | x | $Bi_2O_3$ g | $SrO_2$ g | $Y_2O_3$ g | CuO g |
|---|---|---|---|---|---|
| Exam. | | | | | |
| 1 | 0.1 | 1.3979 | 1.0407 | 0.0339 | 0.4772 |
| 2 | 0.2 | 1.3979 | 1.0048 | 0.0677 | 0.4772 |
| 3 | 0.3 | 5.5915 | 3.8750 | 0.4065 | 1.9090 |
| 4 | 0.4 | 3.7277 | 2.4881 | 0.3613 | 1.2726 |
| Exper. | | | | | |
| A | 0.5 | 3.7277 | 2.3924 | 0.4516 | 1.2726 |
| B | 0.8 | 3.7277 | 2.1053 | 0.7226 | 1.2726 |

TABLE II

| | Lattice Parameters | | |
|---|---|---|---|
| | a (nm) | c (A) | $T_c$ (K) |
| Exam. | | | |
| 1 | 5.44 | 30.85 | 70 |
| 2 | 5.43 | 30.85 | 70 |
| 3 | 5.44 | 30.81 | 65 |
| 4 | 5.45 | 30.66 | 60 |
| Exper. | | | |
| A | 5.46 | 30.60 | — |
| B | 5.46 | 30.27 | — |

The Invention Being claimed is:

1. A superconducting composition having the nominal formula $$Bi_2Sr_{3-x}Y_xCu_2O_{8+y}$$

wherein x is from about 0.05 to about 0.45 and y is from about 0 to about 1, said composition having a superconducting transition temperature (midpoint) of at least 60 K.

2. A superconducting composition as in claim 1 wherein x is from about 0.3 to about 0.4, said composition being essentially single phase.

3. A superconducting composition as in claim 2 wherein x is about 0.3.

4. A superconducting composition as in claim 2 wherein x is about 0.4.

5. A method for conducting an electrical current within a conductor material without electrical resistive losses comprising the steps of:
   cooling a conductor material composed of a composition of claim 1 to a temperature below the $T_c$ of said composition;
   initiating a flow of electrical current within said conductor material while maintaining said material below said temperature.

6. An improved Josephson-effect device wherein the superconductive material comprises the composition of claim 1.

* * * * *